US011349302B2

(12) United States Patent
Cao

(10) Patent No.: US 11,349,302 B2
(45) Date of Patent: May 31, 2022

(54) CIRCUIT STRUCTURE FOR SUPPRESSING SURGE CURRENT

(71) Applicant: ZHENGZHOU YUNHAI INFORMATION TECHNOLOGY CO., LTD., Henan (CN)

(72) Inventor: Weihua Cao, Henan (CN)

(73) Assignee: ZHENGZHOU YUNHAI INFORMATION TECHNOLOGY CO., LTD., Henan (CN)

(*) Notice: Subject to any disclaimer, the term of this patent is extended or adjusted under 35 U.S.C. 154(b) by 646 days.

(21) Appl. No.: 16/097,238

(22) PCT Filed: Nov. 30, 2017

(86) PCT No.: PCT/CN2017/113869
§ 371 (c)(1),
(2) Date: Oct. 26, 2018

(87) PCT Pub. No.: WO2019/019505
PCT Pub. Date: Jan. 31, 2019

(65) Prior Publication Data
US 2021/0226442 A1    Jul. 22, 2021

(30) Foreign Application Priority Data

Jul. 27, 2017   (CN) .......................... 201710625415.1

(51) Int. Cl.
*H02H 9/02*    (2006.01)
*H02M 3/07*    (2006.01)
(Continued)

(52) U.S. Cl.
CPC ................ *H02H 9/02* (2013.01); *H02H 3/08* (2013.01); *H02M 3/07* (2013.01); *H03K 5/08* (2013.01);
(Continued)

(58) Field of Classification Search
CPC ............ H02M 3/07; H02M 1/32; H02M 1/44; H02M 3/04; H03K 5/08; H03K 17/0812;
(Continued)

(56) References Cited

U.S. PATENT DOCUMENTS 9,966,836 B1*   5/2018   Truong ................. H02H 9/005
2004/0004798 A1   1/2004   Priest
(Continued)

FOREIGN PATENT DOCUMENTS

CN        102074942 A      5/2011
CN        102769281 A     11/2012
(Continued)

OTHER PUBLICATIONS

International Search Report for PCT/CN2017/113869 dated May 2, 2018, ISA/CN.
(Continued)

*Primary Examiner* — Danny Nguyen
(74) *Attorney, Agent, or Firm* — Yue (Robert) Xu; Apex Attorneys at Law, LLP

(57) ABSTRACT

Provided is a circuit structure for suppressing surge current, which includes a surge current suppression judgment circuit, a switching control circuit and a self-boosting regulating circuit. An output end of the surge current suppression judgment circuit is connected with the switching control circuit. An output end of the switching control circuit is connected with the self-boosting regulating circuit. The switching control circuit and the self-boosting regulating circuit are both connected with a current input end Vin. An output end of the self-boosting regulating circuit is connected with an input end of the surge current suppression judgment circuit. The output end of the self-boosting regulating circuit is an output end Vout of the whole circuit structure for suppressing surge current.

3 Claims, 1 Drawing Sheet

(51) Int. Cl.
  *H02H 3/08* (2006.01)
  *H03K 5/08* (2006.01)
  *H03K 17/0812* (2006.01)
  *G05F 1/40* (2006.01)
  *H02M 1/32* (2007.01)

(52) U.S. Cl.
  CPC ............... *G05F 1/40* (2013.01); *H02M 1/32* (2013.01); *H03K 17/08122* (2013.01)

(58) Field of Classification Search
  CPC ..... H03K 17/08122; G05F 1/40; G05F 1/612; G05F 3/18; H02H 9/02; H02H 3/08
  USPC ................................... 361/86–87, 93.7–93.9
  See application file for complete search history.

(56) References Cited

U.S. PATENT DOCUMENTS

| | | | |
|---|---|---|---|
| 2005/0275391 A1* | 12/2005 | Ito | G05F 1/575 323/282 |
| 2016/0056624 A1 | 2/2016 | Fang | |
| 2017/0126222 A1* | 5/2017 | O'Sullivan | H03K 17/08122 |

FOREIGN PATENT DOCUMENTS

| | | |
|---|---|---|
| CN | 102857083 A | 1/2013 |
| CN | 103715649 A | 4/2014 |
| CN | 105356433 A | 2/2016 |
| CN | 105471242 A | 4/2016 |
| CN | 205212416 U | 5/2016 |
| CN | 205791499 U | 12/2016 |

OTHER PUBLICATIONS

The 1st Office Action dated Sep. 3, 2018 for the Chinese Patent Application No. CN201710625415.1.

* cited by examiner

CIRCUIT STRUCTURE FOR SUPPRESSING SURGE CURRENT

The present application is a national phase application of PCT international patent application PCT/CN2017/113869, filed on Nov. 30, 2017 which claims the priority to Chinese Patent Application No. 201710625415.1, titled "CIRCUIT STRUCTURE FOR SUPPRESSING SURGE CURRENT", filed on Jul. 27, 2017 with Chinese Patent Office, both of which are incorporated herein by reference in their entireties.

FIELD

The present disclosure relates to the technical field of circuit design, and particularly to a circuit structure for suppressing surge current.

BACKGROUND

In the conventional technology, when using a hot swapping device, because the capacitance effect occurs when the device is plugged in, a huge surge current is generated and applied to a supply voltage, which not only results in a misoperation of overcurrent protection of the supply voltage, but also causes constant vibration of the voltage due to transient excessive current, thereby significantly affecting system reliability and device life.

In the conventional technology, a fuse or a hot swapping control chip is usually used to protect a hot swapping circuit, as illustrated in FIG. 1. However, this protection manner can only protect the current size, cannot control the surge current. It cannot fundamentally solve the problem of hot swapping surge current. This is a shortcoming in the conventional technology.

Therefore, in view of the above shortcoming in the conventional technology, it is necessary to design a circuit structure for suppressing surge current to solve the above problem in the conventional technology.

SUMMARY

The purpose of the disclosure is to provide a circuit structure for suppressing surge current, to solve the shortcoming in the conventional technology.

In order to achieve the above purposes, the following technical solutions are provided by the present disclosure.

A circuit structure for suppressing surge current includes a surge current suppression judgment circuit, a switching control circuit, and a self-boosting regulating circuit. An output end of the surge current suppression judgment circuit is connected with the switching control circuit. An output end of the switching control circuit is connected with the self-boosting regulating circuit. The switching control circuit and the self-boosting regulating circuit are both connected with a current input end Vin. An output end of the self-boosting regulating circuit is connected with an input end of the surge current suppression judgment circuit. The output end of the self-boosting regulating circuit is an output end Vout of the whole circuit structure for suppressing surge current.

Preferably, the surge current suppression judgment circuit includes an operational amplifier M1, a resistor R1 and a resistor R2. One end of the resistor R1 and one end of the resistor R2 are both connected with a non-inverting input end of the operational amplifier M1. The other end of the resistor R1 is connected with a power supply of 12V. The other end of the resistor R2 is grounded. An inverting input end of the operational amplifier M1 is connected with the output end of the self-boosting regulating circuit. A positive power supply end of the operational amplifier M1 is connected with the power supply of 12V. A negative power supply end of the operational amplifier M1 is grounded. An output pin of the operational amplifier M1 is connected with the switching control circuit. The surge current suppression judgment circuit includes voltage divider resistors R1 and R2 and the operational amplifier M1. R1 and R2 set a control voltage range of the circuit, which may be compared with a voltage of the output end Vout through the operational amplifier M1. When the voltage of the output end is in the control voltage range, the operational amplifier M1 outputs a high voltage. When the voltage of the output end is out of the control voltage range, the operational amplifier M1 outputs a low voltage.

Preferably, the switching control circuit includes a resistor R3, a resistor R4, an N type field effect transistor Q1, an N type field effect transistor Q2 and a P type field effect transistor Q3. A D pin of the N type field effect transistor Q1 is connected with the current input end Vin. A B pin and a S pin of the N type field effect transistor Q1 are both connected with the output end Vout. A G pin of the N type field effect transistor Q1 is connected with a S pin of the N type field effect transistor Q2 and a D pin of the P type field effect transistor Q3. A D pin of the N type field effect transistor Q2 is connected with one end of the resistor R3 and one end of the resistor R4. The other end of the resistor R3 is connected with a power supply of 12V. The other end of the resistor R4 is grounded. A G pin of the N type field effect transistor Q2 is connected with the output pin of the operational amplifier M1 and a G pin of the P type field effect transistor Q3. A B pin and a S pin of the P type field effect transistor Q3 are both connected with the self-boosting regulating circuit.

The switching control circuit includes N-Mosfets Q1 and Q2, P-Mosfet Q3, and the resistors R3 and R4. A gate voltage of Q1 may be guaranteed to be a voltage of a variable resistance zone by voltage division of R3 and R4. When the surge current suppression judgment circuit outputs a high voltage, Q2 is turned on and Q3 is turned off, such that Q1 is in the variable resistance zone. An output end current is limited by conductive impedance of Q1, and the output end voltage rises slowly. When the surge current suppression judgment circuit outputs a low voltage, Q2 is turned off and Q3 is turned on, in this case, Q1 is connected to the self-boosting regulating circuit and Q1 is in a full conductive state.

Preferably, the self-boosting regulating circuit includes a capacitor C1 and a diode D1. An anode of the diode is connected with the current input end Vin. A cathode of the diode is connected with the B pin and the S pin of the P type field effect transistor Q3 and one end of the capacitor C1. The other end of the capacitor C1 is connected with the output end Vout.

The self-boosting regulating circuit includes the diode D1 and the capacitor C1. The capacitor C1 is charged through the diode D1 before Q1 is turned on. Voltages at two end of C1 are zero and Vin at this moment. When Q1 is gradually conductive, a voltage of the end of C1 connected with Q1 rises. While a characteristic of reverse blocking of D1 makes C1 unable to discharge, such that a voltage of the end of C1 connected with D1 rises to a voltage of Vin plus Vout, and rises as the output end voltage rises, so that Q1 is in a full conductive state.

The advantageous effects of the present disclosure are described as follows. A N-Mosfet operates in the variable resistance zone and the current is controlled by using the conductive resistance, it is avoided a case that a surge current is generated at the output end at the turn-on moment due to the capacitance effect. The circuit structure has the advantages of simple structure, high reliability and high independence. The circuit structure may be adjusted according to actual requirements, and can thoroughly solve the problem of surge current. In addition, the circuit structure is designed based on a reliable principle, and has a very wide application prospect.

As can be seen that, compared with the conventional technology, the present disclosure has prominent substantive features and notable progress, the advantageous effect of the embodiment is also apparent.

BRIEF DESCRIPTION OF THE DRAWINGS

In FIG. 2, 1 represents a surge current suppression judgment circuit, 2 represents a switching control circuit, 3 represents a self-boosting regulating circuit.

DETAILED DESCRIPTION

The embodiments of the present disclosure are described in detail in conjunction with drawings. The following embodiments are interpretation of the present disclosure, and the present disclosure is not limited to the following embodiments.

Figure 1:
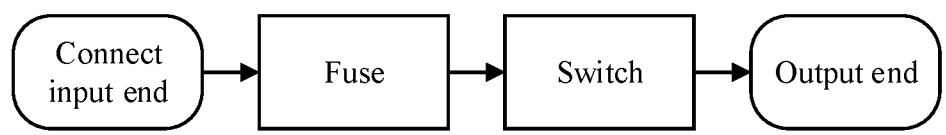
FIG. 1 is a diagram of a circuit structure for suppressing surge current in the conventional technology.
Figure 2:
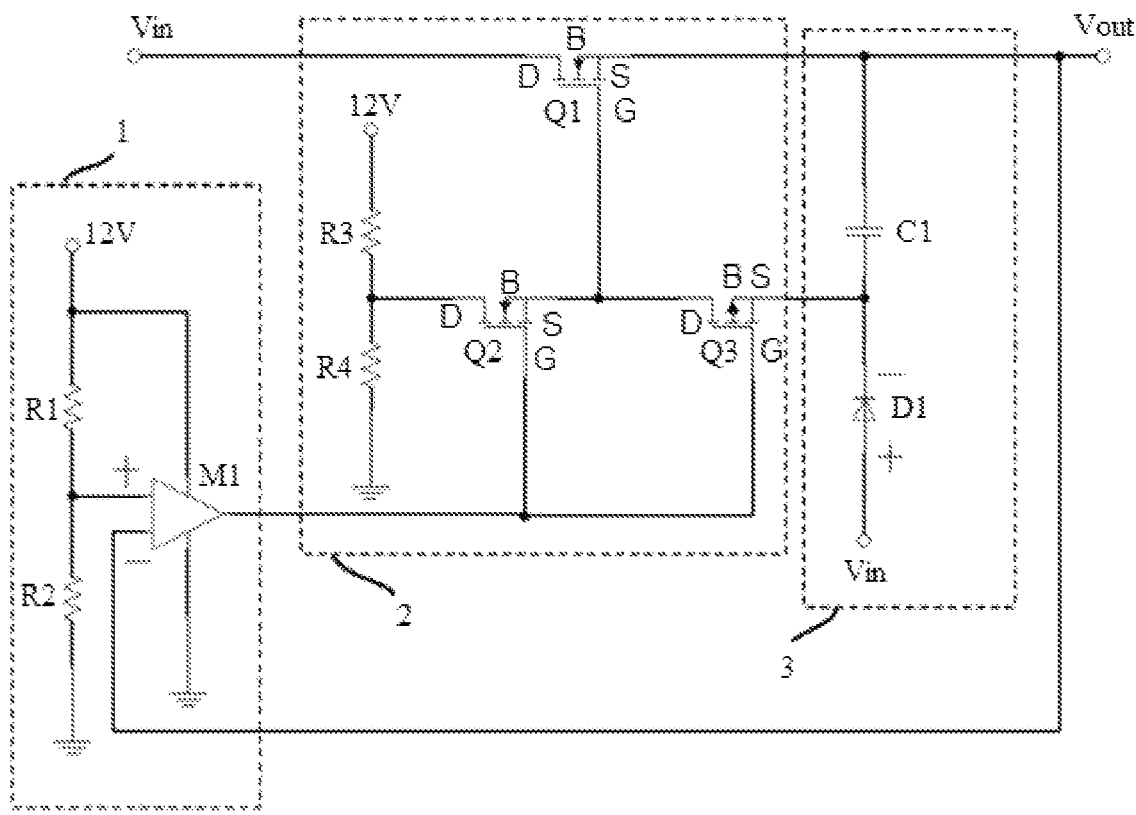
FIG. 2 is a schematic circuit diagram of a circuit structure for suppressing surge current according to the present disclosure.

As illustrated in FIG. 2, a circuit structure for suppressing surge current according to the present disclosure includes a surge current suppression judgment circuit 1, a switching control circuit 2, and a self-boosting regulating circuit 3. An output end of the surge current suppression judgment circuit 1 is connected with the switching control circuit 2. An output end of the switching control circuit 2 is connected with the self-boosting regulating circuit 3. The switching control circuit 2 and the self-boosting regulating circuit 3 are both connected with a current input end Vin. An output end of the self-boosting regulating circuit 3 is connected with an input end of the surge current suppression judgment circuit 1. The output end of the self-boosting regulating circuit 3 is an output end Vout of the whole circuit structure for suppressing surge current.

In this embodiment, the surge current suppression judgment circuit 1 includes an operational amplifier M1, a resistor R1 and a resistor R2. One end of the resistor R1 and one end of the resistor R2 are both connected with a non-inverting input end of the operational amplifier M1. The other end of the resistor R1 is connected with a power supply of 12V. The other end of the resistor R2 is grounded. An inverting input end of the operational amplifier M1 is connected with the output end of the self-boosting regulating circuit. A positive power supply end of the operational amplifier M1 is connected with the power supply of 12V. A negative power supply end of the operational amplifier M1 is grounded. An output pin of the operational amplifier M1 is connected with the switching control circuit. The surge current suppression judgment circuit includes voltage divider resistors R1 and R2 and the operational amplifier M1. R1 and R2 set a control voltage range of the circuit, which may be compared with a voltage of the output end Vout through the operational amplifier M1. When the voltage of the output end is in the control voltage range, the operational amplifier M1 outputs a high voltage. When the voltage of the output end is out of the control voltage range, the operational amplifier M1 outputs a low voltage.

The switching control circuit 2 includes a resistor R3, a resistor R4, an N type field effect transistor Q1, an N type field effect transistor Q2 and a P type field effect transistor Q3. A D pin of the N type field effect transistor Q1 is connected with the current input end Vin. A B pin and a S pin of the N type field effect transistor Q1 are both connected with the output end Vout. A G pin of the N type field effect transistor Q1 is connected with a S pin of the N type field effect transistor Q2 and a D pin of the P type field effect transistor Q3.

A D pin of the N type field effect transistor Q2 is connected with one end of the resistor R3 and one end of the resistor R4. The other end of the resistor R3 is connected with a power supply of 12V. The other end of the resistor R4 is grounded. A G pin of the N type field effect transistor Q2 is connected with the output pin of the operational amplifier M1 and a G pin of the P type field effect transistor Q3.

A B pin and a S pin of the P type field effect transistor Q3 are both connected with the self-boosting regulating circuit.

The switching control circuit includes N-Mosfets Q1 and Q2, P-Mosfet Q3, and the resistors R3 and R4. A gate voltage of Q1 may be guaranteed to be a voltage of a variable resistance zone by voltage division of R3 and R4. When the surge current suppression judgment circuit outputs a high voltage, Q2 is turned on and Q3 is turned off, such that Q1 is in the variable resistance zone. An output end current is limited by conductive impedance of Q1, and the output end voltage rises slowly. When the surge current suppression judgment circuit outputs a low voltage, Q2 is turned off and Q3 is turned on, in this case, Q1 is connected to the self-boosting regulating circuit and Q1 is in a full conductive state.

The self-boosting regulating circuit 3 includes a capacitor C1 and a diode D1. An anode of the diode is connected with the current input end Vin. A cathode of the diode is connected with the B pin and the S pin of the P type field effect transistor Q3 and one end of the capacitor C1. The other end of the capacitor C1 is connected with the output end Vout.

The self-boosting regulating circuit includes the diode D1 and the capacitor C1. The capacitor C1 is charged through the diode D1 before Q1 is turned on. Voltages at two end of C1 are zero and Vin at this moment. When Q1 is gradually conductive, a voltage of the end of C1 connected with Q1 rises. While a characteristic of reverse blocking of D1 makes C1 unable to discharge, such that a voltage of the end of C1 connected with D1 rises to a voltage of Vin plus Vout, and rises as the output end voltage rises, so that Q1 is in a full conductive state.

An operation principle of the technology solution is described as follow.

When power is supplied at the input end, the surge current suppression judgment circuit detects the voltage of the output end Vout firstly. The non-inverting input end of the operational amplifier M1 is connected with a voltage divider circuit of R1 and R2, and sets, by adjusting the resistances of R1 and R2, the operation voltage range of the circuit for controlling the surge current.

Since the surge current is generated by charging the output capacitor when connected to the output end, an effect of charging is equal to that the output end is short circuited to ground. Therefore, the control voltage range may be only slightly greater than a voltage of 0. When the output end voltage is in the control voltage range, the operational amplifier M1 outputs a high voltage. When the output end voltage is out of the control voltage range, the operational amplifier M1 outputs a low voltage.

When the surge current suppression judgment circuit outputs a high voltage, N-Mosfet Q2 is turned on and P-Mosfet Q3 is turned off. The gate of N-Mosfet Q1 is connected with a voltage divider circuit of R3 and R4. Q1 is in the variable resistance zone by adjusting the resistances of R3 and R4 for voltage division. The current of the output end is controlled based on the conductive impedance of Q1 until the voltage of the output end is out of the control voltage range of the surge current suppression judgment circuit. The output of M1 is turned into a low voltage. When the operational amplifier M1 outputs a low voltage, Q2 is turned off and Q3 is turned on such that the gate of Q1 is connected to the self-boosting regulating circuit.

The self-boosting regulating circuit charges the capacitor C1 through the diode D1 before Q1 is turned on. Voltages at two end of C1 are zero and Vin at this moment. When Q1 is gradually conductive, a voltage of the end of C1 connected with Q1 rises. While a characteristic of reverse blocking of D1 makes C1 unable to discharge, such that a voltage of the end of C1 connected with D1 rises to a voltage of Vin plus Vout, and rises as the output end voltage rises, so that Q1 is in a full conductive state.

The embodiments described above are only preferred embodiments of the disclosure, and should not be interpreted as limitation to the disclosure. Any changes without creativity and any improvements and modifications without departing the principle of the disclosure which are made by the skilled person in the art also fall into the protection scope of the disclosure.

The invention claimed is:

1. A circuit structure for suppressing surge current, the circuit structure comprising:
    a surge current suppression judgment circuit;
    a switching control circuit; and
    a self-boosting regulating circuit, wherein
    an output end of the surge current suppression judgment circuit is connected with the switching control circuit, an output end of the switching control circuit is connected with the self-boosting regulating circuit, the switching control circuit and the self-boosting regulating circuit are both connected with a current input end Vin, an output end of the self-boosting regulating circuit is connected with an input end of the surge current suppression judgment circuit, the output end of the self-boosting regulating circuit is an output end Vout of the whole circuit structure for suppressing surge current,
    wherein the surge current suppression judgment circuit comprises an operational amplifier M1, a resistor R1 and a resistor R2, wherein
    one end of the resistor R1 and one end of the resistor R2 are both connected with a non-inverting input end of the operational amplifier M1, the other end of the resistor R1 is connected with a power supply of 12V, the other end of the resistor R2 is grounded, an inverting input end of the operational amplifier M1 is connected with the output end of the self-boosting regulating circuit, a positive power supply end of the operational amplifier M1 is connected with the power supply of 12V, a negative power supply end of the operational amplifier M1 is grounded; an output pin of the operational amplifier M1 is connected with the switching control circuit.

2. The circuit structure for suppressing surge current according to claim 1, wherein the switching control circuit comprises a resistor R3, a resistor R4, an N type field effect transistor Q1, an N type field effect transistor Q2 and a P type field effect transistor Q3, wherein
    a D pin of the N type field effect transistor Q1 is connected with the current input end Vin, a B pin and a S pin of the N type field effect transistor Q1 are both connected with the output end Vout, a G pin of the N type field effect transistor Q1 is connected with a S pin of the N type field effect transistor Q2 and a D pin of the P type field effect transistor Q3;
    a D pin of the N type field effect transistor Q2 is connected with one end of the resistor R3 and one end of the resistor R4, the other end of the resistor R3 is connected with a power supply of 12V, the other end of the resistor R4 is grounded, a G pin of the N type field effect transistor Q2 is connected with the output pin of the operational amplifier M1 and a G pin of the P type field effect transistor Q3; and
    a B pin and a S pin of the P type field effect transistor Q3 are both connected with the self-boosting regulating circuit.

3. The circuit structure for suppressing surge current according to claim 2, wherein the self-boosting regulating circuit comprises a capacitor C1 and a diode D1, wherein an anode of the diode is connected with the current input end Vin, a cathode of the diode is connected with the B pin and the S pin of the P type field effect transistor Q3 and one end of the capacitor C1, and the other end of the capacitor C1 is connected with the output end Vout.

* * * * *